US006764923B2

(12) United States Patent
Dietrich et al.

(10) Patent No.: US 6,764,923 B2
(45) Date of Patent: Jul. 20, 2004

(54) METHOD FOR MANUFACTURING COMPONENTS OF AN SOI WAFER

(75) Inventors: Harry Dietrich, Kirchardt (DE); Volker Dudek, Korntal-Muenchingen (DE); Andreas Schueppen, Lauffen (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 10/145,172

(22) Filed: May 13, 2002

(65) Prior Publication Data

US 2002/0173086 A1 Nov. 21, 2002

(30) Foreign Application Priority Data

May 16, 2001 (DE) .......................... 101 24 032

(51) Int. Cl.[7] .............................................. H01L 21/30
(52) U.S. Cl. ...................................... 438/455; 438/459
(58) Field of Search ................................ 438/455, 456, 438/458, 459

(56) References Cited

U.S. PATENT DOCUMENTS

| | | | |
|---|---|---|---|
| 3,974,006 A | | 8/1976 | Rodriguez |
| 5,166,082 A | * | 11/1992 | Nakamura et al. .......... 438/234 |
| 5,234,535 A | | 8/1993 | Beyer et al. |
| 5,453,394 A | | 9/1995 | Yonehara et al. |
| 5,583,059 A | | 12/1996 | Burghartz |
| 5,821,149 A | | 10/1998 | Schueppen et al. |
| 5,882,987 A | | 3/1999 | Srikrishnan |
| 5,973,257 A | * | 10/1999 | Cantarini et al. ........... 136/249 |
| 6,057,212 A | * | 5/2000 | Chan et al. .................. 438/455 |
| 6,091,112 A | | 7/2000 | Kwon |
| 6,103,009 A | | 8/2000 | Atoji |
| 6,146,979 A | | 11/2000 | Henley et al. |
| 6,197,695 B1 | | 3/2001 | Joly et al. |
| 6,413,874 B1 | | 7/2002 | Sato |

FOREIGN PATENT DOCUMENTS

| | | |
|---|---|---|
| DE | 2535813 | 11/1976 |
| DE | 19609933 | 9/1997 |
| DE | 19757269 | 7/1998 |
| EP | 0996150 | 4/2000 |
| EP | 1045448 | 10/2000 |

OTHER PUBLICATIONS

Witek P. Maszara, "SOI by Wafer Bonding: A Review"; Electrochem. Soc. PV 90–6; 1990; pp. 199 to 212B.
H. S. Gamble; "Polish Stop Technology for Silicon on Silicide on Insulator Structures" by H. S. Gamble; Perspectives, Science and Technologies for Novel Silicon on Insulator Devices, 2000, pp. 17 to 28.
Dietrich et al.; US 2002/0173119 A1, published on Nov. 21, 2002.
Dietrich et al.; US 2002/0173118 A1, published on Nov. 21, 2002.
S,B, Goody et al., "High Speed Bipolar on Bonded Buried Silicide SOI ($S^2OI$)", ESSDERC< 1998, pp. 500 to 503.

* cited by examiner

Primary Examiner—John F. Niebling
Assistant Examiner—Christopher Lattin
(74) Attorney, Agent, or Firm—W. F. Fasse; W. G. Fasse

(57) ABSTRACT

An SOI wafer includes a substrate, and an insulating intermediate layer and a surface layer successively thereon. At least one laterally limited suicide area is formed in and/or on the surface layer. Then an oxide layer is provided on the surface layer of the SOI wafer and/or on a second silicon wafer, before the two wafers are bonded to each other along the oxide layer. The substrate and the insulating intermediate layer are removed to leave a bonded multi-layered wafer. At least one device component is fabricated in and/or on the surface layer to include the silicide area as a functional element of the device component. Different types of components, e.g. MOS and bipolar transistors, can be fabricated together on the same wafer, and HF characteristics are improved by the low ohmic suicide area(s).

41 Claims, 1 Drawing Sheet

METHOD FOR MANUFACTURING COMPONENTS OF AN SOI WAFER

CROSS-REFERENCE TO RELATED APPLICATIONS

This application is related to copending U.S. application Ser. Nos. 10/145,013 and 10/145,169, both filed on May 13, 2002.

BACKGROUND

1. Field of the Invention

The present invention relates to a method for manufacturing components on a multi-layered silicon wafer by bonding together two initial wafers.

2. Description of the Related Technology

Such a method is known from the publication U.S. Pat. No. 5,583,059. This describes the integration of a so-called "fully depleted" n- and p-FET in combination with an npn heterobipolar transistor (HBT) on a wafer with an insulating intermediate layer (SOI wafer) which has an active layer thickness of less than 0.2 $\mu$m. The silicon layer around the active components is completely removed in order to isolate the individual components and reduce the parasitic capacitances. Furthermore, the thickness of the active layer in the area of the npn transistor is increased by means of an epitaxy process in order to form a collector layer for the manufacture of an npn transistor. Provided that no selective epitaxy process is performed, protective layers, which are removed again in subsequent process steps, are applied in order to protect the FET components. The base of the HBT is also deposited during the multi-stage epitaxy process, during which a so-called drift-HBT is created which does not have a low-doped emitter layer between emitter contact layer and base layer.

The disadvantage of the process architecture described is that the thickness of the active layer has to be substantially increased in the area of the npn transistors in order to adapt electrical parameters such as early voltage and collector series resistance. For this purpose, the collector connector layer (buried layer) must have a thickness which lies in the order of magnitude of the starting thickness of the active silicon layer, whereby it is not possible to increase the doping of the collector connector layer into the range of 10 e17 cm3 with acceptable expenditure, as an activation of this concentration, among other factors, leads to strong outdiffusion.

Another method for manufacturing a component on an SOI wafer is known from the publication S. B. Goody, et al, "High Speed Bipolar on S²OI", in ESSDERC 1998. This describes the manufacture of an npn transistor which has a buried, silicided collector connector layer. For this purpose, a complete silicide layer is formed on the surface of the oxide layer of a first silicon wafer which has a complete oxide layer. An SOI wafer with a complete, buried silicide layer is subsequently manufactured by means of wafer bonding, by bonding the surface of a second silicon wafer to the silicide layer. The second silicon wafer is then thinned to the desired thickness in order to manufacture npn transistors in the remaining silicon layer.

The disadvantage of the process architecture described is that this method cannot be extended to the integration with MOS-transistors with acceptable expenditure, as a complete silicide layer substantially worsens the electrical properties by increasing the parasitic couplings, such as for example the delay time. Furthermore, it is difficult to bond the surface of the complete silicide layer to the surface of another wafer firmly and without offsets.

Furthermore, the process architecture for an npn-HBT for a silicon wafer without an insulating intermediate layer is described in the publication DE 196 09 933, in which the current amplification is increased by creating an epitactic, relatively low-doped emitter layer which suppresses the tunneling of the minorities into the emitter. Furthermore, limiting frequencies above 50 GHz are achieved at relatively low collector currents with a relatively thick, highly-doped collector connector layer (buried layer), which reduces the connection resistance of the collector, and the adaptation of the collector thickness and the doping. Furthermore, a high standard of reproducibility of the electrical parameters is achieved in the manufacturing process by means of a so-called "inside-outside spacer"-technique and avoiding dry etching processes on the emitter windows. The disadvantage of this is that the manufacturing process, which is exclusively oriented to the manufacture of bipolar transistors, can only be integrated with MOS-transistors at great expense. Moreover, further improvement of the HF characteristics is hindered by the use of a conventional silicon wafer as parasitic couplings occur with the substrate.

An objective of the developments in the field of semiconductor technology is to develop methods with which bipolar and HB-transistors for super high frequency applications can be combined with such FE transistors, that have extremely short delay times, without diminishing the electrical properties of any of the types of components involved. On the one hand this requires, for example, very thin active silicon layers with a thickness in the range of 0.2 $\mu$m and less for the MOS-transistors, whereas on the other hand silicon layers thicker than 0.4 $\mu$m are required for the bipolar transistors. Furthermore, the parasitic couplings to the substrate must be suppressed to the greatest possible extent. An important area of application for such combinations of different types of components is the manufacture of highly integrated circuits, which not only have very fast digital signal processing but also make HF outputs available at super high frequencies.

SUMMARY OF THE INVENTION

The object of the present invention is to provide a method of the type stated at the beginning with which different types of high frequency components can be manufactured together on one wafer with acceptable expenditure.

The above objects have been achieved according to the invention in a method of manufacturing components on a multi-layered silicon wafer, involving bonding together two initial wafers by a wafer bonding process.

According to this, the essence of the invention lies in bonding two wafers to form a new wafer which has buried silicided areas and an insulating intermediate layer, and components of various types, such as for example bipolar transistors as well as FE transistors with in each case optimized HF parameters, are integrated in the uppermost silicon layer on one wafer. For this purpose, a silicon wafer with an insulating intermediate layer is created on a silicon wafer, consisting of a first silicon wafer comprising a surface layer on top of an insulating intermediate layer arranged on a substrate and a second silicon wafer with a surface, by bonding the respective surfaces of the two wafers and, before bonding, at least one silicided area is created within or on the surface of the surface layer of the first silicon wafer, and subsequently at least one insulating layer is applied to the surface of at least one silicon wafer, and after bonding the substrate and at least part of the insulating layer of the first silicon wafer is removed, and then at least one component is manufactured in a series of process steps.

Investigations by the applicant have shown that it is advantageous for the manufacture of high frequency components to select a thin surface layer, preferably with a thickness less than 1.0 μm. Furthermore, it is advantageous to protect the surrounding regions by means of an oxide mask during the manufacture of the silicide areas, and to create the silicided areas in different depths through further process steps, such as for example silicon etching.

An advantage of the new method in comparison to the previous state-of-the-art is that, before bonding, only those areas on the first wafer are silicided in which the insertion of a silicide layer will improve the electrical properties of the components which are created in a manufacturing process subsequent to the bonding. The silicided areas are buried by bonding the two wafers, whereby the areas lie at different depths within the surface layer. In particular, the buried layers which serve as connecting layers for components can be replaced by means of the buried silicide areas. As the conductivity of silicides is substantially greater than that of doped silicon, the thickness of the uppermost silicon layer and/or the connection resistances can be reduced. The differences in the thickness of the surface layer, which are required by the different types of components, are substantially reduced. Furthermore, the electrical and in particular the HF characteristics of vertically structured components are improved.

In a development of the method, it is advantageous to create the insulating intermediate layer, which preferably has a thickness greater than 0.2 μm, by means of deposition and to apply it exclusively to the surface of the first wafer, as this makes it unnecessary to process the second wafer before bonding. Moreover, it is advantageous for certain regions of the insulating intermediate layer to have a different thickness, in particular a greater thickness in those areas in which the components manufactured in the surface layer require a particularly high decoupling from the underlying substrate material.

In another development of the method, the thickness of some areas of the surface layer is changed before or after bonding in order to adapt them to the various requirements of the electrical parameters of the individual types of components. For this purpose, starting from a very thin silicon layer, which is for example less than 0.2 μm, the thickness of the surface layer is increased in certain regions by means of a selective epitaxy, or starting from a thick surface layer, which is for example in the range of 1.0 μm, the thickness of the layer is reduced in certain regions by creating a thermal oxide, for example a so-called LOCOS oxidation. In conjunction with the replacement of the buried layer areas by silicides, the thickness of the surface layer can be advantageously adapted to the electrical parameters of the individual component types which are manufactured after bonding.

In a development of the method, an MOS-transistor is created as a generic component. For this purpose, it is advantageous if the surface layer is very thin and the source and drain zones of the NMOS or the PMOS completely penetrate the surface layer of the first silicon wafer (fully depleted), as such transistors have particularly short delay times and switching times. The source area can be short-circuited to the body area of the transistor by means of a buried silicided layer in order to improve the HF characteristics, such as for example the switching time of the transistor.

In another development of the method, a bipolar transistor, which preferably has a vertical structure, is manufactured as a generic component. Both PNP and npn type transistors can be created with this development. In this case, the transistors are manufactured in the regions of the surface layer which have a thick surface layer in comparison to the regions with the MOS-transistors. The collector connector of the transistors is formed by means of a buried silicided area in order to lower the saturation voltages of the transistors. Furthermore, at low voltages, the voltage drop in the transistor is reduced by the reduction of the collector series resistance so that the maximum limiting frequency is reached at low collector currents and high HF outputs can be achieved at low voltages with HF transistors, such as for example a heterobipolar transistor.

In a development of the method, a capacitor is manufactured as a generic component, in which a buried silicide area is used as the first capacitor plate in an advantageous manner. For example, layers of oxide or nitride may be used as the dielectrical layer, which may be created during the manufacturing process for other components. Moreover, a further silicide layer, as well as a metalizing layer or a doped polysilicon layer may be used as the second capacitor plate. Furthermore, it is advantageous to insert the silicide layer deep into the surface layer, for example by trench etching, before bonding in order to place the silicide layer near the surface after bonding.

In another development of the method, it is advantageous for the creation of complex integrated circuits to manufacture MOS-transistors together with bipolar transistors, in particular HB-transistors, on one wafer, and to electrically isolate the individual components from one another by means of trench etching. As the boxes so created are isolated, the components lying in the boxes may be operated at different electrical potentials. The trench etching is preferably performed by means of a trench process which has a good selectivity to the insulating intermediate layer. An inexpensive and simple trench process may be used as a complete silicide layer is not present. A further advantage is that no metallic ions are released during the trench etching, that is especially high temperature resistant silicides can be created for burying the layers, the slightest traces of the metallic ions of such silicides, such as for example cobalt or nickel, cause very damaging contamination of the components.

BRIEF DESCRIPTION OF THE FIGURES

The method according to the invention is described in the following by means of an embodiment in conjunction with a sequence of drawings. They show.

DESCRIPTION OF THE PREFERRED EMBODIMENTS

Figure 1A:
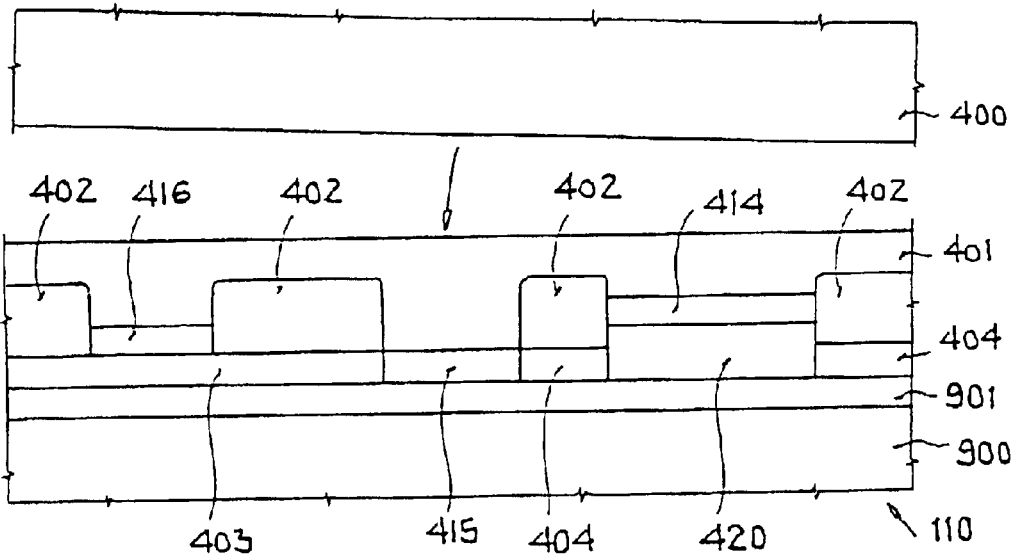
FIGS. 1a–c A diagrammatic sequence of a manufacturing process which creates a plurality of types of semiconductor components on a silicon wafer which has an insulating intermediate layer and buried silicided areas.
Figure 1B:
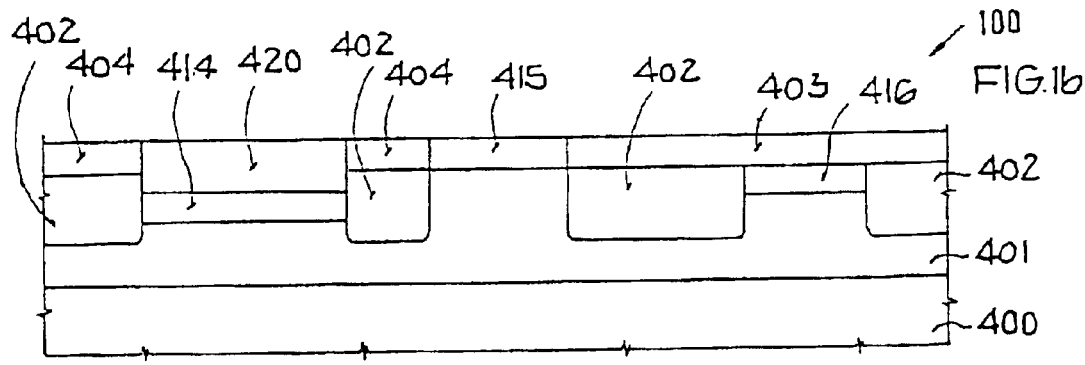
Figure 1C:
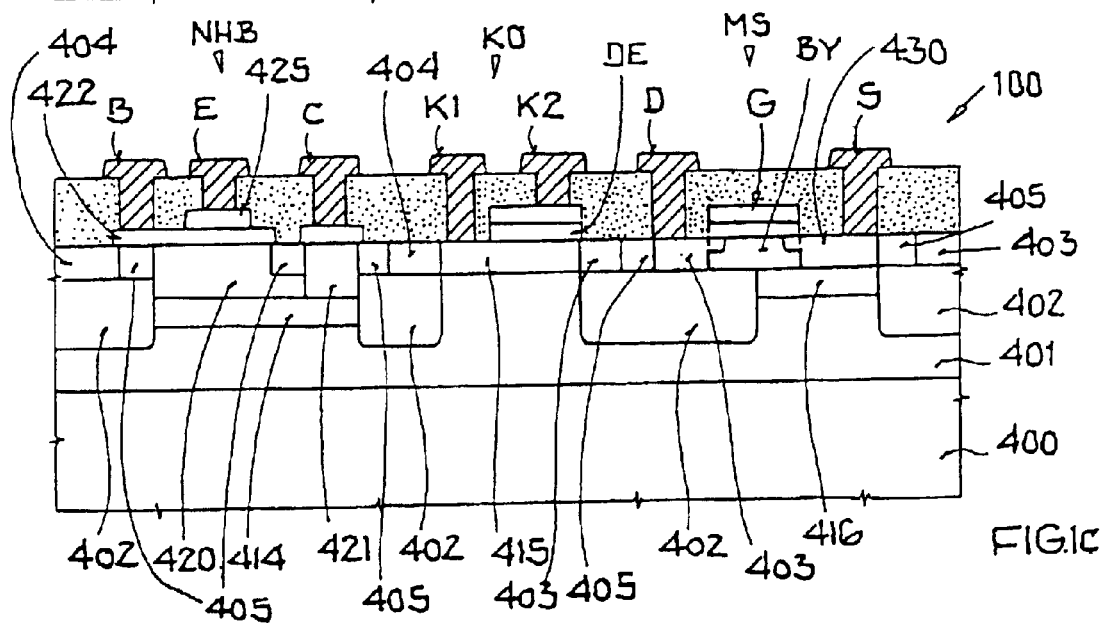

The sequence of process steps shown in FIGS. 1a–c illustrates the manufacturing process by means of which a plurality of types of semiconductor components are created together on a wafer 100 with an insulating intermediate layer of silicon oxide (SOI wafer) which has buried silicided areas. In this case, the complete intermediate layer electrically insulates the surface layer, which is formed of a monocrystalline silicon layer, from the substrate material. Such SOI wafers are used, for example, as starting material for the manufacture of current-free substrate, integrated circuits. The manufacturing process is explained in greater detail in the following.

FIG. 1a shows a cross-section of a first SOI wafer 110 and a second silicon wafer 400, in which the surface of the first SOI wafer 110, which consists of an oxide layer 401, is bonded to the silicon surface of the second wafer 400. Furthermore, the first SOI wafer 110 has a silicon substrate 900 upon which is an oxide layer 901 as an insulating layer, the thickness of which preferably lies between 0.1 μm and 2.0 μm. There are a plurality of silicon areas 403, 404 and 420 on the oxide layer 901. The starting point for the structuring, the process sequence of which is not shown, is a complete silicon layer, the thickness of which corresponds to that of area 420, and is preferably 0.6 μm. The area 420 is n-doped with a concentration of $10e17/cm^3$ in a subsequent process step. The layer thicknesses of silicon areas 403 and 404 are adapted by means of a subsequent LOCOS oxidation, in which the oxide areas 402 are created by the structuring of the LOCOS oxide. In a subsequent process step, a suicide layer is created in the areas 414, 415 and 416, whereby the silicon layer has been previously thinned or removed in area 415 by means of trench etching. In a subsequent process step, the oxide layer 401 is applied by means of deposition and planarized by means of a CMP process in order to subsequently bond the surface of the first wafer 110 to the surface of wafer 400 and thus create the SOI wafer 100.

FIG. 1b illustrates the cross-section of the bonded SOI wafer 100, in which the substrate 900 and the oxide layer 901 of the first SOI wafer 110 have preferably been removed by a combination of a chemical mechanical polishing step and a wet chemical etching step, and the wet chemical process step for etching the substrate has a selectivity in the etching rate between silicon and oxide.

FIG. 1c illustrates the cross-section of the bonded SOI wafer 100, in which three different types of components have been manufactured, an npn-HBT NHB above the silicided area 414, a capacitor KO by means of the silicided area 415, and an MOS-transistor MS by means of the silicided area 416, in a sequence of further process steps which are not individually shown. In order to manufacture the npn-HBT NHB, a collector connector zone 421, which is highly doped, is inserted into the n-doped area 420 in order to make a low ohmic connection to the silicided area 414 which serves as the collector connector layer of the npn-HBT NHB. Subsequently, a plurality of insulation trenches 405 are created by means of trench isolation, preferably by a so-called STI process, in the uppermost silicon layer 403 and 404 in order to manufacture individual silicon boxes for the components which are to be created. Subsequently, the base and emitter layers of the npn-HBT NHB are created by means of a multi-stage epitaxy process. The areas of the MOS-transistor MS are protected by means of an oxide layer during the manufacture of the npn-HBT NHB. After the manufacture of the HB-transistor NHB, the MOS-transistor MS is created above the silicided area 416, in which the adaptation of the transistor areas and the source and drain implantations are selected such that a "fully depleted" MOS-transistor MS is created, the body area BY of which is short-circuited to the source by means of the silicided area 416. Starting from the silicided area 415, which forms the first plate K1 of a capacitor KO, the capacitor KO is completed with the use of the manufacturing steps of both the npn-HBT NHB and of the MOS-transistor MS, in which the protective layer of the MOS region is used as dielectric DE, and the gate connector layer of the MOS-transistor MS is used as the second plate K2 of the capacitor KO.

The advantage of the sequence shown lies in structuring the first SOI wafer 110 before bonding the surface to another wafer 400. In this case, the creation of various silicon thicknesses and the manufacture of silicided areas which lie at different depths, enables optimal adaptation of the individual component boxes to the various electrical parameters of the respective component types. As the important process steps take place before bonding, the SOI wafer 100 created has a plane and defect-free surface. Particularly for the integration of super high frequency transistors, the new method enables simple integration of MOS and bipolar transistors, in which their respective HF characteristics can be further improved by means of the buried silicide layers. Moreover, the thickness of the insulating intermediate layer may be substantially increased in some areas, such as for example under the HF bond pads, for better decoupling. Moreover, the method may also be extended to the burial of silicided areas on wafers without an insulating intermediate layer.

What is claimed is:

1. A method of manufacturing a multi-layered wafer with at least one device component thereon, comprising the steps:
    a) providing a first initial wafer (110) comprising silicon and including a first substrate (900), a first insulating intermediate layer (901) on said first substrate, and a first surface layer on said first insulating intermediate layer;
    b) providing a second initial wafer (400) comprising silicon, and including a second substrate;
    c) forming at least one laterally limited silicide area (414, 415, 416) formed of a silicide in and/or on said first surface layer of said first initial wafer;
    d) providing at least one insulating layer (401) on at least one of an exposed surface of said second initial wafer after said step b) and an exposed surface of said first surface layer of said first initial wafer after said step c);
    e) after said steps a), b), c) and d), bonding together said first initial wafer and said second initial wafer along a new outer surface of said at least one insulating layer (401);
    f) after said step e), removing said first substrate (900) and at least part of said first insulating intermediate layer (901) of said first initial wafer, to leave said multi-layered wafer including at least part of said first surface layer, said at least one laterally limited silicide area (414, 415, 416), at least part of said second initial wafer (400), and said at least one insulating layer (401) between said at least one laterally limited silicide area and said at least one part of said second initial wafer; and
    g) fabricating said at least one device component in and/or on said first surface layer to include said at least one laterally limited silicide area respectively as a functional element of said at least one device component.

2. The method according to claim 1, wherein at least one non-silicide area is located laterally adjacent to said at least one silicide area.

3. The method according to claim 2, further comprising etching a trench in said first surface layer before said step c), wherein said step C) comprises forming said silicide area in said trench, and wherein said non-silicide area is a silicon-containing area (403, 404) of said first surface layer adjoining said trench.

4. The method according to claim 2, further comprising an oxidation step that forms said non-silicide area as an oxide area (402) laterally adjacent to said silicide area.

5. The method according to claim 4, wherein said silicide area is formed on top of said first surface layer.

6. The method according to claim 2, wherein said silicide area is formed on top of said first surface layer.

7. The method according to claim 1, further comprising etching at least one trench in said first surface layer before said step c), wherein said step c) comprises forming said at least one laterally limited silicide area only in said at least one trench.

8. The method according to claim 1, wherein said silicide area is formed on top of said first surface layer, and further comprising an oxidation step that forms an oxide area laterally adjacent to said silicide area on said first surface layer.

9. The method according to claim 1, wherein said silicide area is formed at least partially embedded in said first surface layer.

10. The method according to claim 9, further comprising an oxidation step that forms an oxide area laterally adjacent to said silicide area.

11. The method according to claim 1, wherein said at least one laterally limited silicide area includes plural laterally limited silicide areas respectively formed at different lateral locations and at different depths in and/or on said first surface layer.

12. The method according to claim 1, further comprising doping a dopant into at least one laterally limited doped silicon area (420) of said first surface layer before said step d).

13. The method according to claim 1, wherein said second initial wafer (400) provided in said step b) does not include an insulating layer.

14. The method according to claim 1, wherein said second initial wafer (400) provided in said step b) consists of said second substrate which consists of a single monolithic monolayer wafer.

15. The method according to claim 14, wherein said single monolithic monolayer wafer is a monolithic monolayer silicon wafer.

16. The method according to claim 1, wherein said first surface layer of said first initial wafer has a thickness of less than 1.0 µm.

17. The method according to claim 1, wherein said at least one insulating layer (401) formed in said step d) consists of silicon dioxide.

18. The method according to claim 1, wherein said at least one insulating layer (401) formed in said step d) has a total thickness greater than 0.2 µm.

19. The method according to claim 1, further comprising, before said step d), reducing a thickness of said first surface layer of said first initial wafer in at least one defined limited area.

20. The method according to claim 1, further comprising, before said step d), carrying out a thermal oxidation to form a thermal oxide at at least one defined limited area of said first surface layer of said first initial wafer.

21. The method according to claim 1, further comprising, before said step d), increasing a thickness of said first surface layer of said first initial wafer in at least one defined limited area.

22. The method according to claim 21, wherein said increasing of said thickness of said first surface layer is carried out by selective epitaxy.

23. The method according to claim 1, wherein said step d) comprises providing only one said insulating layer on only one said exposed surface of only one of said first initial wafer and said second initial wafer, and the other of said first and second initial wafers does not have an insulating layer on said exposed surface thereof.

24. The method according to claim 23, wherein said step d) comprises providing said insulating layer on said exposed surface being an exposed surface of said first initial wafer including a surface of said at least one laterally limited silicide area.

25. The method according to claim 24, wherein said step of providing said insulating layer comprises depositing an oxide to form said insulating layer of said oxide.

26. The method according to claim 1, wherein said removing in said step f) removes said first initial insulating intermediate layer (901) to expose a new surface of said first surface layer on a side thereof opposite said at least one insulating layer (401).

27. The method according to claim 1, wherein said silicide is a cobalt silicide.

28. The method according to claim 1, wherein said silicide is a nickel silicide.

29. The method according to claim 1, wherein said at least one device component includes an MOS transistor.

30. The method according to claim 29, wherein said MOS transistor includes source and drain regions that completely penetrate through said first surface layer.

31. The method according to claim 29, wherein said MOS transistor includes source and body regions that contact and are short-circuited by a respective silicide area of said at least one silicide area.

32. The method according to claim 29, wherein said at least one device component further includes a bipolar transistor.

33. The method according to claim 32, wherein said at least one device component further includes a capacitor.

34. The method according to claim 29, wherein said at least one device component further includes, a capacitor.

35. The method according to claim 1, wherein said at least one device component includes a capacitor.

36. The method according to claim 35, wherein a respective silicide area of said at least one silicide area provides a capacitor plate of said capacitor.

37. The method according to claim 35, wherein said at least one device component further includes a bipolar transistor.

38. The method according to claim 1, wherein said at least one device component includes a bipolar transistor.

39. The method according to claim 38, wherein said bipolar transistor is a vertical transistor formed on a respective silicide area of said at least one silicide area, and wherein said respective silicide area provides a collector connector layer of said vertical transistor.

40. The method according to claim 39, wherein said vertical transistor is a vertical heterobipolar transistor.

41. The method according to claim 1, wherein said at least one silicide area includes plural silicide areas, said at least one device component includes plural device components respectively fabricated on said plural silicide areas, and further comprising carrying out trench isolation to laterally separate and isolate said plural device components from one another.

* * * * *

UNITED STATES PATENT AND TRADEMARK OFFICE
CERTIFICATE OF CORRECTION

PATENT NO. : 6,764,923 B2
DATED : July 20, 2004
INVENTOR(S) : Dietrich et al.

It is certified that error appears in the above-identified patent and that said Letters Patent is hereby corrected as shown below:

Title page,
Item [57] ABSTRACT,
Line 3, after "limited", replace "suicide" by -- silicide --;
Line 14, after "ohmic", replace "suicide" by -- silicide --.

Column 5,
Line 20, after "a", replace "suicide" by -- silicide --.

Column 6,
Line 61, after "step", replace "C)" by -- c) --.

Column 8,
Line 39, after "further", replace "includes, a" by -- includes a --.

Signed and Sealed this

Fourteenth Day of December, 2004

JON W. DUDAS
*Director of the United States Patent and Trademark Office*